United States Patent [19]

Hosaka

[11] Patent Number: 5,001,527
[45] Date of Patent: Mar. 19, 1991

[54] SEMICONDUCTOR DEVICE WITH THIN INSULATION FILM
[75] Inventor: Takashi Hosaka, Tokyo, Japan
[73] Assignee: Seiko Instruments Inc., Japan
[21] Appl. No.: 569,375
[22] Filed: Aug. 13, 1990

Related U.S. Application Data

[63] Continuation of Ser. No. 71,987, Jul. 10, 1987, abandoned.

[51] Int. Cl.$^5$ .............. H01L 29/68; H01L 29/34; H01L 29/04; H01L 27/02
[52] U.S. Cl. .................. 357/23.5; 357/54; 357/59; 357/51
[58] Field of Search .......... 357/54, 59 I, 23.5, 357/51

[56] References Cited

U.S. PATENT DOCUMENTS

| | | | |
|---|---|---|---|
| 4,282,540 | 8/1981 | Ning et al. | 357/23 |
| 4,288,256 | 9/1981 | Ning et al. | 148/1.5 |
| 4,419,385 | 12/1983 | Peters | 437/238 |
| 4,577,390 | 3/1986 | Haken | 357/54 |

FOREIGN PATENT DOCUMENTS 0002997 7/1979 European Pat. Off. .
0118878 9/1984 European Pat. Off. .

OTHER PUBLICATIONS

8172 IEEE International Solid-State Circuits Conference, vol. 24 (1981), Feb., New York, U.S.A., pp. 152–153, "Memory Techniques", H. H. Chao et al.
Solid State Technology, Apr. 1977, "Low Pressure CVD Production Processes for Poly, Nitride, and Oxide", pp. 63–70, R. S. Rosler.

Primary Examiner—Rolf Hille
Assistant Examiner—Robert P. Limanek
Attorney, Agent, or Firm—Bruce L. Adams; Van C. Wilks

[57] ABSTRACT

In the step of forming a thin insulation film with the thickness of less than 1,000 Å on the polycide electrode and wiring after formiung the polycide electrode and wiring, a semiconductor device having preferable insulation performance and high reliability is formed by using a silicon oxide film ($SiO_2$) formed by a chemical vapor deposition process using a dichlorosilane ($SiH_2Cl_2$) gas and a nitrous oxide ($N_2O$) gas under a reduced pressure of from 0.1 mbar to 2 mbar and at a temperature from 700° C. to 950° C. as the insulation film.

13 Claims, 1 Drawing Sheet

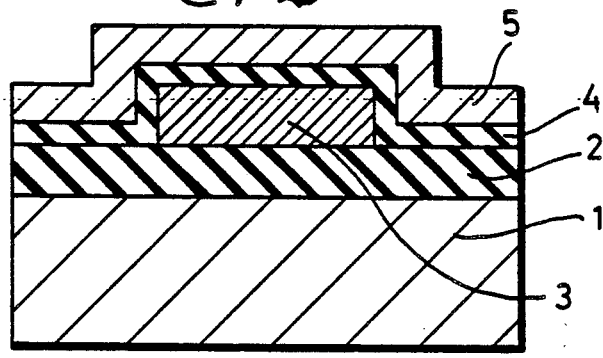
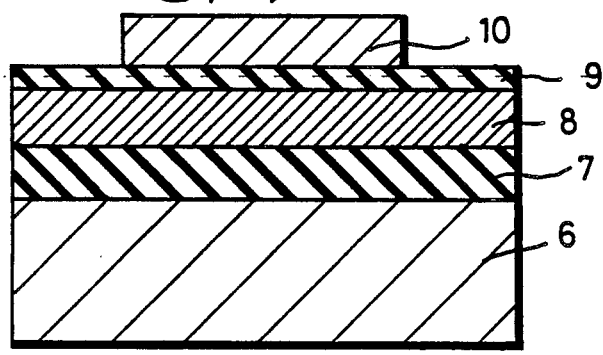
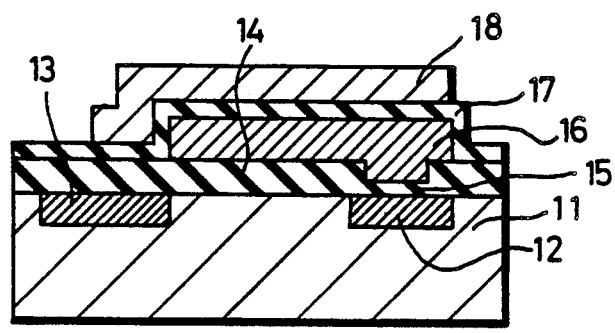

SEMICONDUCTOR DEVICE WITH THIN INSULATION FILM

This is a continuation of application Ser. No. 071,987, filed July 10, 1987, abandoned.

BACKGROUND OF THE INVENTION

This invention concerns a semiconductor device having a thin insulation film for forming a non-volatile memory or a capacitive component.

In a semiconductor device having polycrystalline silicon electrodes and wiring, it is known to use insulation film, polyimide film and thermally oxidized film of polycrystalline silicon formed by a chemical vapor deposition (CVD) process as the material for insulating the polycrystalline silicon electrodes and wiring from the electrodes and wiring formed thereover (for example, Al, polycrystalline silicon, etc. are used as the eletroconductive material).

However, in the case of using a thin insulation film with a thickness of less than 1,000 Å as the insulation material, a thermally oxidized film of polycrystalline silicon has been used since such provides a preferable insulating performance and good control of the film thickness.

Due to the demand of making the structure finer and the operation speed higher for IC devices in recent years, polycrystalline silicon as the material for the electrodes and wiring has been gradually replaced with polycide comprising a two layered structure of polycrystalline silicon and metal silicide. However, thermally oxidized films of polycide exhibit poor film thickness uniformity and unfavorable insulating performance. Accordingly, since the insulating performance of a thin insulating film of less than 1,000 Å thickness formed by thermally oxidizing the periphery of polycide used as the wiring and electrodes is also poor, it has not been possible to use the polycide as the material for the electrodes and wiring of a semiconductor device.

In a structure in which a polycide is used as the electrode and wiring of a lower layer, and an electrode and wiring of an upper layer is formed thereover with a thin insulation film therebetween, a thermally oxidized film formed by thermally oxidizing the periphery of the polycide has a poor film thickness uniformity and a not so favorable insulating performance. Accordingly, since the insulating performance of a thin insulating film of less than 1,000 Å formed by thermally oxidizing the periphery of the polycide is also poor, it has not been possible to use the polycide as the material for the electrodes and wiring of a semiconductor device. Therefore, there has been a problem that it is impossible to obtain a higher operation speed by decreasing the resistance of the electrodes and wiring in such a semiconductor device.

SUMMARY OF THE INVENTION

The object of the present invention is to provide a single-layer silicon oxide film formed by using a chemical deposition process (CVD process) as the insulation film on the polycide electrode and wiring of a semiconductor device. That is, a single silicon oxide film formed by reacting a dichlorosilane ($SiH_2Cl_2$) gas and a nitrous oxide ($N_2O$) gas in a chemical gas phase reaction under a high temperature atmosphere (hereinafter referred to as high temperature CVD silicon oxide film) is used as the insulation film.

BRIEF DESCRIPTION OF THE DRAWINGS

FIG. 1 is a cross-sectional view illustrating the structure according to the present invention, FIG. 2 is a cross-sectional view illustrating the structure for obtaining a capacitive component according to the present invention, and FIG. 3 is a cross-sectional view illustrating a structure of a non-volatile memory formed by using the present invention.

DETAILED DESCRIPTION OF PREFERRED EMBODIMENTS

This invention will now be described specifically referring to preferred embodiments in conjunction with the drawings. FIG. 1 is a cross-sectional view for a semiconductor device according to the present invention. In FIG. 1, after forming an insulation film 2 on a substrate 1, polycide electrode and wiring 3 is formed. Then, CVD silicon oxide film 4 is layered over the polycide 3 by using a CVD process. Then, an electrode and wiring 5 is formed over the film 4 to obtain a structure shown in FIG. 1. The substrate 1 shown in FIG. 1 may be a semiconductor such as of silicon, germanium, gallium arsenide and indium phosphide, an insulator such as of glass or aluminum, or a metal such as stainless steel or iron. As the insulation film 2, there can be used a silicon oxide film, a silicon nitride film, alumina, etc.

The polycide 3 is formed generally as described below. At first, a polycrystalline silicon film is formed by means of chemical vapor deposition process (CVD process) or physical vapor deposition process (PVD process), etc. In this case, phosphor, arsenic and boron may be doped. The doping may be conducted after the formation of the polycrystalline silicon film. Generally, doping is conducted by using a diffusion process. Heat treatment may be applied to the polycrystalline silicon film after the formation of the polycrystalline silicon film.

Then, a silicide film is laminated over the polycrystalline silicon film by way of a CVD process or PVD process (laminated). The silicide film usable herein can include molybdenum silicide, tungsten silicide, platinum silicide, titanium silicide, tantalum silicide, zirconium silicide and palladium silicide. Then, heat treatment may be applied to stabilize the composition formed so far.

A dual layered film prepared by laminating a silicide membrane on a polycrystalline silicon membrane is generally referred to as a polycide. As another method of preparing the polycide, it has been known to prepare a metal film over a polycrystalline silicon film, followed by heat treatment. The metal film is formed by a CVD or PVD process. The metal film usable herein can include, for example, molybdenum, tungsten, platinum, titanium, tantalum, zirconium and palladium.

Reference is now made to the CVD silicon oxide film 4 formed over the polycide 3 as a feature of the present invention. The silicon oxide film laminated by using the CVD process shows a satisfactory insulating performance even on the polycide film. Particularly, a silicon oxide film prepared by a chemical deposition process by using a dichlorosilane ($SiH_2Cl_2$) gas and a nitrous oxide ($N_2O$) gas has an extremely preferable insulating performance. The density of the membrane of the silicon oxide film grown from a dichlorosilane ($SiH_2Cl_2$) gas and a nitrous oxide ($N_2O$) gas generally suffers from the effects of pressure and temperature used upon formation. The silicon oxide film in the present invention is generally formed under a forming pressure within a range of about from 0.1 mbar to 2.0 mbar and at a temperature within a range of about from 700° C. to 950° C. The silicon oxide film prepared under the above-mentioned conditions is satisfactory in film thickness controllability and shows sufficient values for the insulating performance and the density of the film. Further, if the ratio of the dichlorosilane ($SiH_2Cl_2$) gas becomes higher, the silicon oxide film contains too much silicon and such worsens the insulating performance. Accordingly, a desireable insulating performance can be obtained by setting the ratio of flow rate between $N_2O$/$SiH_2Cl_2$ to greater than 5. Since a silicon oxide film formed under the conditions of a forming pressure from 0.1 mbar to 2.0 mbar and at a temperature from 700° C. to 950° C. has a favorable film thickness controllability, a thin film of less than 1000 Å can be laminated uniformly over the polycide. A significant feature of the present invention lies in thinly laminating a single-layer CVD silicon oxide film over the polycide electrode and wiring.

Explanation will now be made to the formation of a capacitive component for use with a semiconductor device by using a silicon oxide film according to the present invention. A device having a capacitance suitable for charging electric charges has often been used in dynamic RAMs or analog and digital circuits. In the case of forming a capacitive component using a silicon oxide film as an insulation film between electrodes, it is necessary to form a thin insulation film in order to obtain a large capacity with a small surface area and it is also required that the accumulated electric charges be effectively stored without discharge leakage. In the case of forming a capacitive component with an insulation film disposed over a polycide film, the insulation film is formed by a CVD process using a $SiH_2Cl_2$ gas and an $N_2O$ gas in order to obtain favorable capacitance characteristics. Although the structure shown in FIG. 1 also constitutes a capacitive component, formation of the capacitive component will be described in more detail referring to FIG. 2. Reference numerals 6, 7, 8, 9 and 10 in FIG. 2 correspond to reference numerals 1, 2, 3, 4, 5 in FIG. 1 respectively. An extremely thin CVD silicon oxide film 9 with a thickness of less than 1000 Å is laminated over a polycide film 8 and, an electrode and wiring 10 is formed further thereover. Then, a capacitive component is constituted by the polycide film 8, the silicon oxide film 9 formed through the reaction between $SiH_2Cl_2$ gas and $N_2O$ gas, and the electrode and wiring 10. It is possible to form the silicon oxide film 9 into an extremely thin film of less than 100 Å thickness if required. When a lateral type vacuum CVD device is used under suitable growing conditions (e.g., flowing $SiH_2Cl_2$ gas at 25 sccm and $N_2O$ gas 250 sccm, under a pressure of 0.4 mbar and a temperature of 850° C.), since the growing rate is 6.2 and the uniformity is less than ±5%, a silicon oxide film of less than 100 Å thickness can be formed with good controllability. Since the insulating performance of the silicon oxide film is extremely favorable, a capacitive component with less electric discharge can be formed within a small surface area.

The present invention is applicable also to a nonvolatile memory having a floating gate. Explanation of this embodiment will be made referring to FIG. 3. In FIG. 3, a floating gate electrode 16 is formed of a polycide. A single-layer thin CVD silicon oxide film 17 of 100–500 Å thickness is laminated over the floating gate electrode 16 and, further, a control gate 18 is formed. Electrons are injected from a dense N type impurity region 12 in a silicon substrate 11 by way of a thin silicon oxide film 15 to the floating gate electrode 16, by which the voltage of the floating gate can be changed. In general, as the thickness of the thermal oxide film of polycide is reduced, the insulating withstand voltage is worsened. However, when the CVD oxide film according to the present invention is used, since an extremely thin insulation film can be formed on the floating gate electrode (polycide) 16, it is possible to easily vary the voltage on the floating gate electrode by using a control gate electrode 18 as an external electrode. Further, since a thin silicon oxide film formed by the CVD process by using a $SiH_2Cl_2$ gas and a $N_2O$ gas (CVD silicon oxide film) has an extremely excellent insulation property, the leakage of electric current from the floating gate electrode 16 through the CVD silicon oxide film 17 is extremely low. Accordingly, electrons injected to the floating gate electrode 16 can be stored over an extremely long period of time within the floating gate. Therefore, the memory has characteristics comparable with those of conventional memories using polysilicon as the floating gate, both for the cycle of rewriting and charge retention time. Further, since wiring can be made with low resistance by using the polycide, reading and rewriting can be conducted at a higher speed than usual.

The high temperature CVD $SiO_2$ film is favorable in the uniform film thickness and extremely satisfactory also in the insulating performance and, accordingly, it can be used also as a thin insulating film with a thickness of less than 100 Å and it can also be formed over the polycide electrode and the wiring of the polycide.

The polycide electrode and wiring can be formed by laminating two or more layers according to the present invention. That is, after forming the polycide at the first layer, a thin CVD silicon oxide film is laminated. Then, after forming the polycide at the second layer, a thin CVD silicon oxide film is again laminated. By repeating the above-described procedures, it is possible to laminate the polycide electrode and wiring by any desired number of layers. Three-layered polysilicon electrode and wiring has been used for non-volatile memories in recent years and it is possible to obtain a non-volatile memory of three-layered polycide electrode and wiring by using the present invention.

Although a CVD silicon oxide film is laminated directly over the polycide electrode and wiring in the preferred embodiment according to the present invention, identical properties can also be obtained when a thin CVD silicon oxide film is laminated after the oxidization of the polycide.

As has been described above, according to the present invention, since a thin silicon oxide film formed by using a CVD process can be formed as an insulation film over the polycide electrode and wiring, the polycide electrode and wiring can be used in a device adopting a thin insulation film, and higher device operation speed than usual can be attained.

I claim:

1. A semiconductor device comprising:
   a substrate;
   a first electrode disposed on and insulated from the substrate, the first electrode being comprised of a polycide which comprises a polycrystalline silicon and a metal silicide;
   an insulating film formed on the first electrode, the insulating film being comprised of a single chemical-vapor-deposited oxide film and having a thickness less than 1000 Å; and a second electrode disposed on the insulating film.

2. A semiconductor device as claimed in claim 1; wherein the semiconductor device comprises a semiconductor capacitive device; and the first and second electrodes comprise capacitor electrodes of the semiconductor capacitive device.

3. A non-volatile semiconductor memory device comprising:

a substrate;

a floating electrode disposed on and insulated from the substrate, the floating electrode being comprised of a polycide which comprises a polycrystalline silicon and a metal silicide;

an insulating film formed on the floating electrode, the insulating film being comprised of a single chemical-vapor-deposited silicon dioxide film and having a thickness in the range of 100 to 500 Å, and a control electrode disposed on the insulating film.

4. A semiconductor device as claimed in claim 1; wherein the insulating film is formed by chemical reaction of dichlorosilane ($SiH_2Cl_2$) and dinitrogen monoxide ($N_2O$) at a temperature in the range of 700° C. to 950° C.

5. A semiconductor device as claimed in claim 4; wherein the insulating film is formed at a growth rate of 6.2 Å/min.

6. A semiconductor device as claimed in claim 1; wherein the insulating film has a thickness less than 100 Å.

7. A semiconductor device comprising:

a substrate;

a polycide layer disposed on and insulated from the substrate, the polycide layer being comprised of a polycrystalline silicon and a metal silicide; and an insulating film formed on a surface portion of the polycide layer, the insulating film being comprised of a single layer of a chemical-vapor-deposited oxide and having a thickness less than 1000 Å.

8. A semiconductor device according to claim 7; wherein the single film layer of oxide is composed of silicon dioxide.

9. A semiconductor device according to claim 7; including an electrode layer disposed on the insulating film.

10. A semiconductor device according to claim 9; wherein the semiconductor device comprises a non-volatile semi-conductor memory device, the polycide layer defines a floating electrode of the memory device, and the electrode layer defines a control electrode of the memory device.

11. A semiconductor device according to claim 9; wherein the semiconductor device comprises a semiconductor capacitive device, and the polycide and electrode layers define electrodes of the capacitive device.

12. A semiconductor device according to claim 7; wherein the insulating film has a thickness less than 100 Å.

13. A semiconductor device according to claim 7; wherein the insulating film has a thickness in the range of 100 to 500 Å.

* * * * *